United States Patent [19]
Krasulick

[11] Patent Number: 5,500,867
[45] Date of Patent: Mar. 19, 1996

[54] LASER PACKAGE HAVING AN IMPEDANCE MATCHING TRANSFORMER

[75] Inventor: Stephen B. Krasulick, Fogelsville, Pa.

[73] Assignee: AT&T Corp., Murray Hill, N.J.

[21] Appl. No.: 304,997

[22] Filed: Sep. 13, 1994

[51] Int. Cl.⁶ ........................................................ H01S 3/00
[52] U.S. Cl. ........................................................ 372/38
[58] Field of Search ........................................ 372/38, 81

[56] References Cited

U.S. PATENT DOCUMENTS

| | | |
|---|---|---|
| 4,379,273 | 4/1983 | Bender . |
| 4,485,361 | 11/1984 | Bender . |
| 5,132,639 | 7/1992 | Blauvelt et al. ........................ 330/149 |
| 5,216,393 | 6/1993 | Wandel . |
| 5,361,156 | 11/1994 | Pidgeon ................................ 359/161 |

*Primary Examiner*—Rodney Brovernick
*Assistant Examiner*—Robert E. Wise

[57] ABSTRACT

A circuit housed in a semiconductor laser package for interfacing a semiconductor laser with an external laser drive source. The circuit having a transformer with primary and secondary windings for matching the impedance of the laser drive source and the semiconductor laser. The circuit further includes a tilt circuit for compensating the negative sloping effects of the transformer.

11 Claims, 3 Drawing Sheets

5,500,867

LASER PACKAGE HAVING AN IMPEDANCE MATCHING TRANSFORMER

BACKGROUND OF THE INVENTION

1. Technical Field.

The present invention relates generally to a semiconductor laser package and more particularly to a semiconductor laser package having an integral impedance matching transformer.

2. Discussion of Related Art

Semiconductor lasers are commonly used as optical sources in long distance communication systems for producing analog or digital modulated optical signals for transmission over fiber optics link. Typically, the laser is driven by a laser drive source which provides a DC current for biasing the laser and a high frequency modulation current which modulates the laser optical output at frequencies of 50 MHz to 1 GHz or higher. At these operating frequencies, any electrical connections of significant length must be considered as transmission lines and the circuit design must include considerations such as stray capacitive effects and the compatibility of the impedance of the driving and receiving components.

Typically, the RF drive circuit which produces the modulation signals has an output impedance which is several times higher than the impedance of the semiconductor laser. To avoid transmission line reflection problems due to the impedance mismatch of the laser and the RF drive source, several techniques have been employed to interface the laser to the laser drive source with impedance matching circuitry.

A well known and traditional approach is to place a resistor Ri having a resistive value equivalent to the difference between the drive circuit and the laser impedance, as shown in FIG. 1. Also shown in FIG. 1 is a typical laser drive source having a DC current source Idc being fed through a coil Ldc which is combined in a bias tee format with the RF current drive hn through resistor Rm and capacitor Cc. At operating frequencies of 50 MHz to 1 GHz, the RF drive circuit typically has an output impedance of around 50 to 75 ohms. As an example, if the impedance of the RF drive circuit is 75 ohms and the laser is 5 ohms, an Ri value of 70 ohms would impedance match the RF drive circuit to the laser.

A drawback of such an approach is the loss of RF energy dissipated by the resistor Ri, which must be compensated by higher RF drive requirements at the laser drive source. With the resistive matching technique such as in FIG. 1, the placement of the resistor Ri within the laser package or outside the laser package has virtual insignificant effects on the high frequency signal characteristics of the drive signals present at the laser.

U.S. Pat. No. 5,216,393 to Wandel proposes an impedance matching approach by use of a transformer. The transformer includes multiple windings which match the output impedance of the RF drive circuit and the input impedance of the semiconductor laser. Compared to the resistive impedance matching approach, the transformer dissipation of RF energy is much less, typically 4 dB less than the resistor.

The transformer impedance matching approach works well except at higher operating frequencies, such as at around 500 MHz to 1 GHz, the output of the laser tends to exhibit a negative sloping characteristic due to the transformer. The sloping is typically around 2 dB degradation in current amplitude. Another important consideration is the placement of the transformer. If the transformer is not disposed close to the semiconductor laser, as would be the case if the transformer is external to a semiconductor laser package, the parasitic effects from the stray inductance and capacitance at higher operating frequencies will become more pronounced and problematic.

Therefore, there exists a need for a semiconductor laser package having impedance matching circuitry which matches the impedance of the RF drive circuitry and the impedance of the semiconductor laser while minimizing the resistive loss and the parasitic capacitive and inductive effects.

SUMMARY OF THE INVENTION

The semiconductor laser package according to the present invention comprises: a semiconductor laser; an interface configured for interfacing the laser to a laser drive source, the interface includes a transformer for impedance matching the laser drive source with the laser; and a housing for enclosing the laser and the interface. Preferably, the housing hermetically encloses the laser and the interface.

The package may be a 14 pin Integrated Laser Module (ILM) butterfly package, and the laser package includes a single input lead configured to receive a DC bias current and an RF modulation current from the laser drive source.

Preferably, the semiconductor laser has an input impedance of around 5 ohms and the laser drive source has an output impedance of around 75 ohms. And, the laser operates in the range of around 50 MHz to around 1 GHz.

The laser package also preferably includes a tilt circuit configured for positive slope compensation from around 200 Mhz to 1.0 GHz.

The transformer is configured to receive modulation current from the laser drive source and also configured to step up the modulation current prior to passage of the modulation current through the laser.

BRIEF DESCRIPTION OF THE DRAWINGS

The features and advantages of the present invention will be more apparent from the following descriptions and accompanying drawings in which.

DETAILED DESCRIPTION OF THE PREFERRED EMBODIMENT

Figure 1:
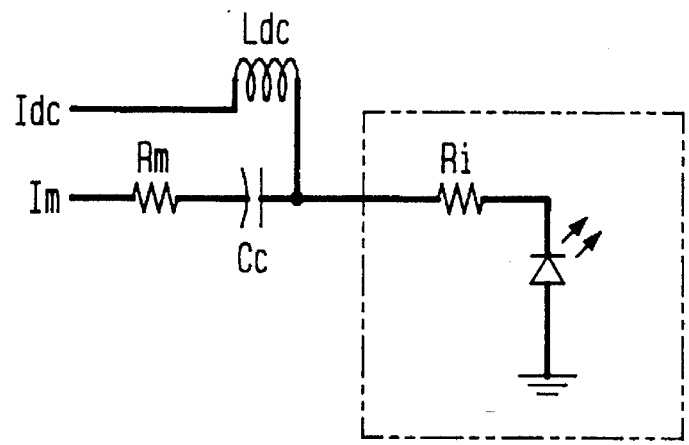
FIG. 1 illustrates a prior art laser package employing a resistive impedance matching.
Figure 2:
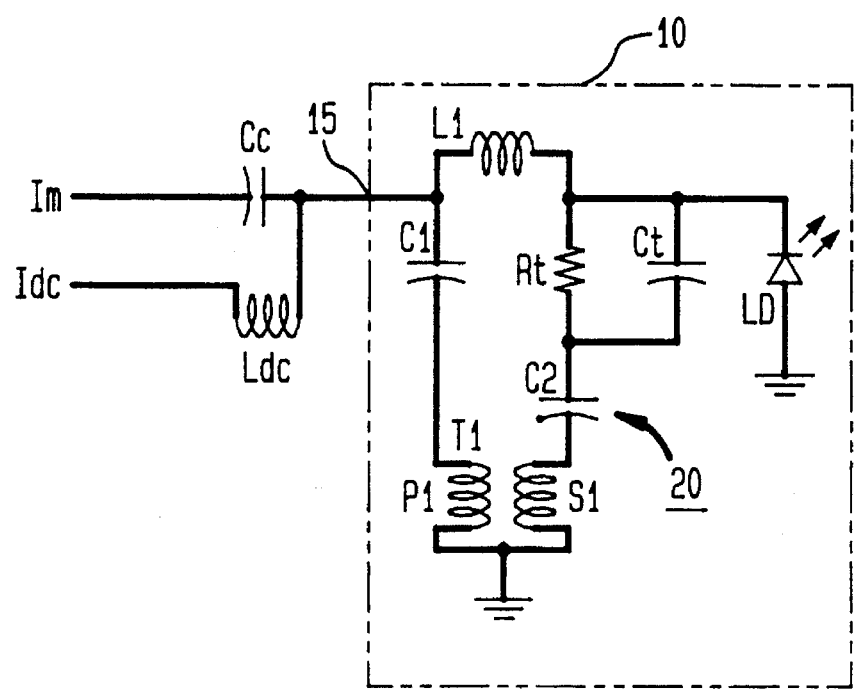
FIG. 2 shows the laser package according to the present invention.
Figure 5:
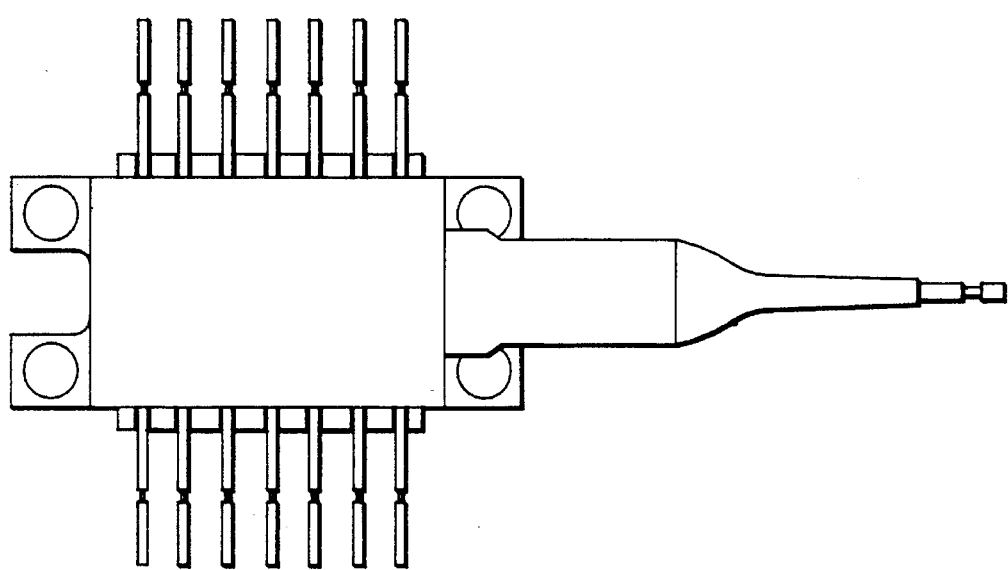
FIG. 5 shows an Integrated Laser Module package suitable for housing the components as shown in FIG. 2.

The present invention is directed to a laser package which houses a semiconductor laser, preferably an analog semiconductor laser which operates from 50 MHz to 1 GHz or higher. The package is preferably dimensioned at around one inch by 0.6 inches by 0.4 inches, having 14 dual-side pinouts with seven pins on each side having 0.1 inch centers. The package is also preferably hermetically sealed. This type of package is commonly known to one skilled in the art as the 14 pin butterfly ILM package. An ILM package suitable for the device according to the present invention is shown in FIG. 5. The components enclosed therein are shown in FIG. 2.

The laser package according to the present invention takes advantage of the analog lasers being a current driven device and the transformer being constant power devices. Given the modulation current expressed as:

$$I(t) = (I_o - I_{th}) \sum_{i=1}^{N} m_i \cos(2\pi f_i + \phi_i) \quad (1)$$

where $I(t)$ is the modulation current as a function of time, $I_0$ is the bias current, $I_{th}$ is the threshold current of the laser, $m_i$ is the modulation index, $f_i$ is the modulation frequency and $\phi_i$ is the phase of the modulation signal.

The current of the transformer, being a constant power device, can be expressed as:

$$I_s^2 Z_s = I_p^2 Z_p \quad (2)$$

where Is is the current in the transformer secondary, Zs is the impedance of the secondary winding, Ip and Zp are the primary current and impedance, respectively. From equation (2), the secondary current can be expressed as:

$$I_s = I_p \sqrt{Z_s/Z_p} \quad (3)$$

If the secondary winding of the transformer is used to provide the RF drive to the semiconductor laser, Is is the same as the modulation current $I(t)$. Also, it can be seen from the above equations that the modulation current Im or Is is modified by the square root of the ratio of the secondary to primary impedances of the transformer. Therefore, by appropriate selection of Zs and Zp, it is possible to increase or step up the modulation current which passes through the laser for a fixed input (primary) current. Alternatively, it is possible to provide a fixed modulation current to the laser with a reduced input current.

Referring to FIG. 2, the laser package 10 includes semiconductor laser LD which is connected to interface 20 which is integrally connected within the laser package 10. The interface circuit 20 has an input RF impedance at around 75 ohms and an output RF impedance at around 25 ohms; it passes a DC bias current while stepping up the modulation current. The interface circuit includes a "tilt" circuit which serves as an equalization circuit for compensating the negative sloping effects of transformer T1 at higher frequencies. It can be seen that with the placement of the interface circuit 20, including the transformer T1 inside the laser package 10, the line length of the connection between the transformer T1 and the semiconductor laser LD is minimal and the problems associated with stray capacitive effects at high frequencies are virtually eliminated.

The laser source drive circuit (not shown) produces a DC bias current Idc and a modulation current Im through coil Ldc and capacitor Cc, respectively, Idc and Im are coupled in a bias tee format and are input to the laser package 10 through a single input lead 15.

In operation, L1, an RF choke of around 500 nanohenries passes the DC bias current Idc to laser LD while blocking the modulation current Im. The modulation current Im passes capacitors C1, through transformer T1, capacitor C2, and through tilt circuit (Rt and Ct) to the laser LD. C1 and C2 are preferably 0.1 microfarad capacitors which pass RF modulation signals and block any DC component of the modulation signal. Transformer T1 has a primary winding P1 having an RF impedance of around 75 ohms and a secondary winding S1 having an RF impedance at around 25 ohms. With these impedances and applying equation 3 above, it can be shown that the laser modulation current is stepped up or increased by about 4.77 dB. With the secondary winding of T1 at 25 ohms and the laser LD at 5 ohms, the resistor Rt is chosen to be 20 ohms to match the impedances.

Interface circuit 20 includes a "tilt" circuit which is formed by resistor Rt and capacitor Ct, with Ct being a 10 picofrarad capacitor. The tilt circuit has positive sloping characteristics which interacts with the modulation signal output from the secondary S1 of the transformer T1 to compensate the negative sloping effects of the transformer laser package, enabling operation of the laser package to one GHz or higher.

Advantageously, the circuitry of the interface 20 as configured enables the integration of the interface 20 into the laser package 10 without requiting a change in the pinout of the butterfly package 10.

Figure 3:
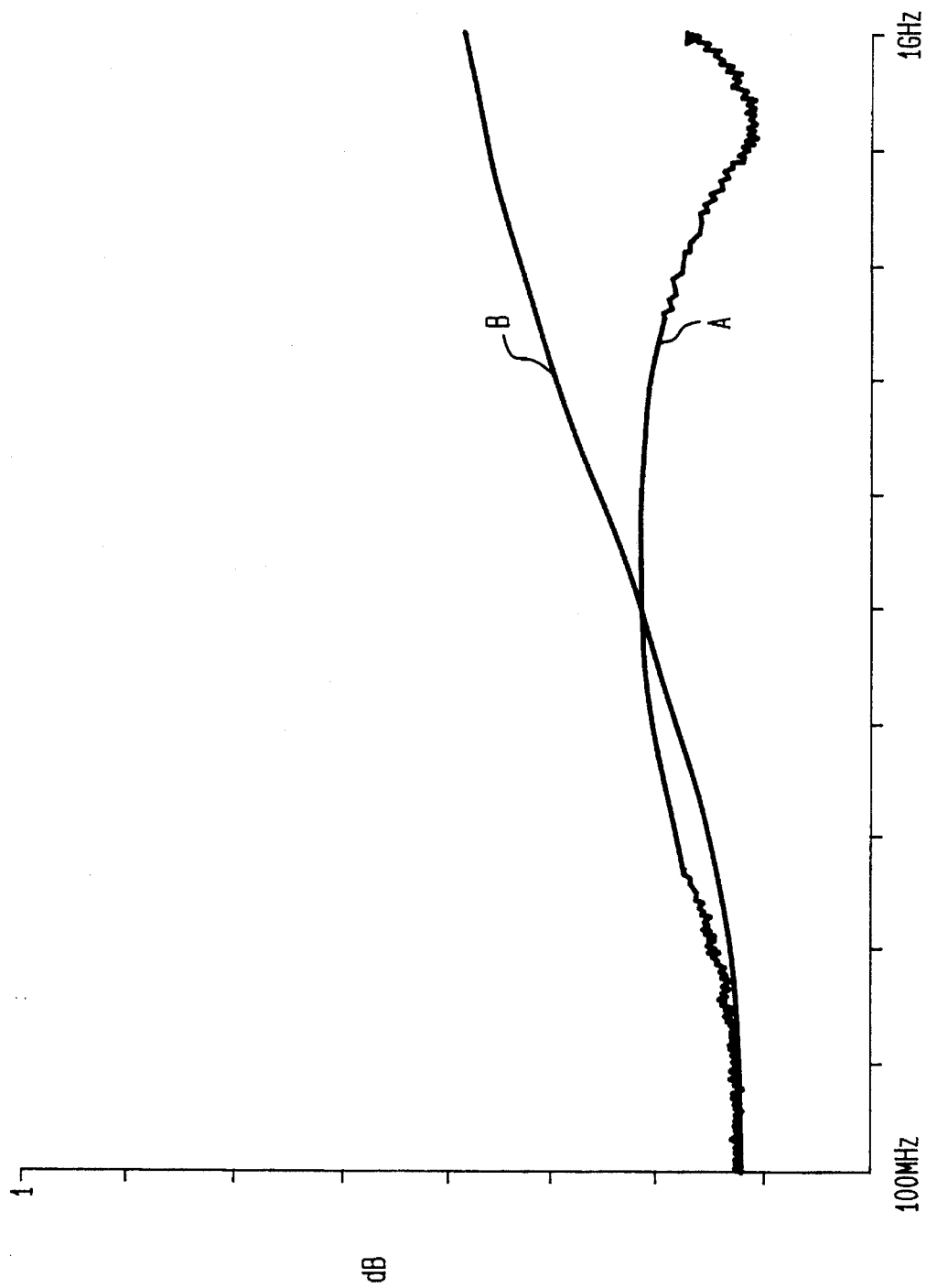
FIG. 3 shows graphs of the tilt circuit frequency response and input return loss between 100 MHz to 1 GHz (the tilt circuits input return loss)

FIG. 3 shows the effect of the tilt circuit on the input signal at frequencies from 100 MHz to 1 GHz. Graph A shows the tilt circuit's input return loss and graph B shows the frequency response of the tilt circuit. As can be seen, the tilt circuit improves the circuit amplitude by 2.5 dB at frequencies up to 1 GHz.

Figure 4:
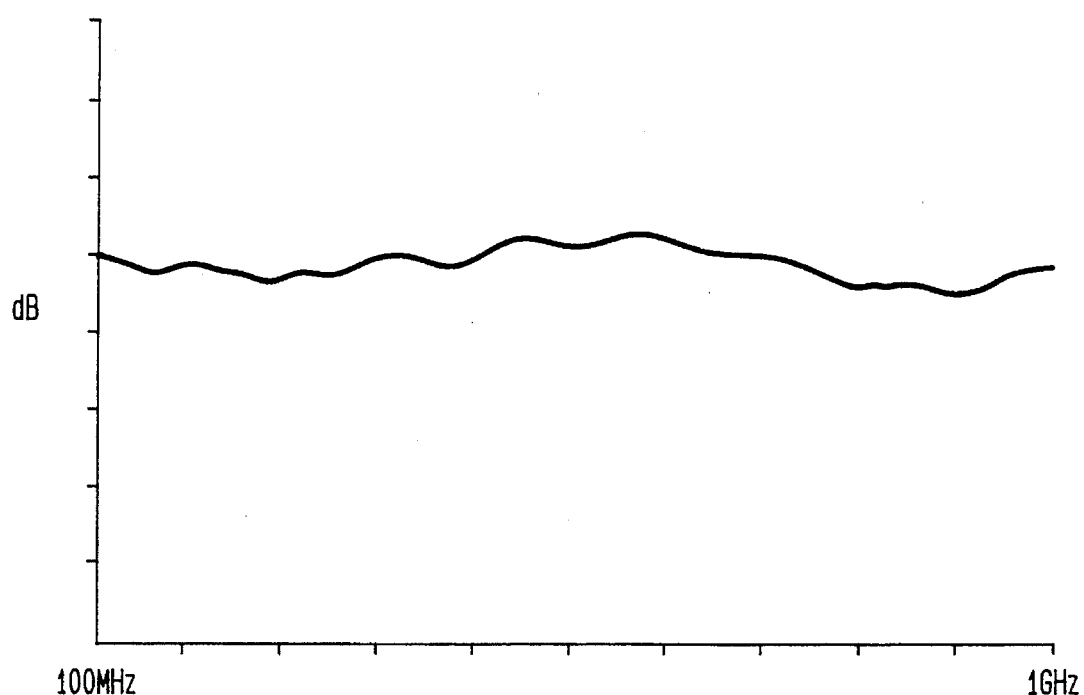
FIG. 4 shows the frequency response of the laser package of FIG. 2.

FIG. 4 shows the frequency response of the laser package 10 having the interface 20 as shown in FIG. 2. As shown, the frequency response is relatively flat throughout the operation range of 100 MHz to 1 GHz.

While the invention has been particularly shown and described with reference to the preferred embodiment, it will be understood by those skilled in the art that various modifications in form and detail may be made therein without departing from the scope and spirit of the invention.

What is claimed is:

1. A semiconductor laser package, comprising:

a semiconductor laser;

an interface configured for interfacing said laser to a laser drive source, said interface includes a transformer for impedance matching said laser drive source with said laser;

a housing for enclosing said laser and said interface; wherein said laser has an input impedance of around 5 ohms and said laser drive source has an output impedance of around 75 ohms.

2. A semiconductor laser package, comprising:

a semiconductor laser;

an interface configured for interfacing said laser to a laser drive source, said interface includes a transformer for impedance matching said laser drive source with said laser;

a housing for enclosing said laser and said interface; wherein said package is a 14 pin butterfly package.

3. A semiconductor laser package, comprising:

a semiconductor laser;

an interface configured for interfacing said laser to a laser drive source, said interface includes a transformer for impedance matching said laser drive source with said laser;

a housing for enclosing said laser and said interface; wherein said transformer is configured to receive modulation current from said laser drive source and configured to step up said modulation current prior to its passage through said laser.

4. A laser package according to claim 3 wherein said modulation current is stepped up around 4.7 dB by said transformer.

5. A semiconductor laser package, comprising:

a semiconductor laser;

an interface configured for interfacing said laser to a laser drive source, said interface includes a transformer for impedance matching said laser drive source with said laser;

a housing for enclosing said laser and said interface;

wherein said laser operates in the range of around 50 MHz to around 1 GHz.

6. A semiconductor laser package comprising:

a semiconductor laser configured for operation when biased with a bias current and configured for producing laser optical outputs which vary correspondingly to modulation currents, said laser having a first modulation impedance;

means for interfacing said laser with an external drive source producing said bias and modulation currents;

means for impedance matching said first modulation impedance of said laser with a second modulation impedance of said external drive source; and a housing configured for enclosing said semiconductor laser, said means for interfacing, and said means for impedance matching, wherein said laser has a modulation impedance of around 1 to 7 ohms and said external drive source has a modulation impedance of around 50 to 75 ohms.

7. A circuit for interfacing a semiconductor laser with a laser drive source producing a bias current and a modulation current, said circuit comprising:

an RF choke being coupled to said laser and said laser drive source for passing said bias current and blocking said modulation current;

A capacitor being coupled to said laser drive source and a transformer, said capacitor configured for blocking said bias current and passing said modulation current; and said transformer being coupled to said capacitor and said laser, said transformer having primary and secondary windings, the primary winding having an impedance matching said laser drive source and said secondary winding having an impedance matching said laser.

8. The circuit according to claim 7 wherein said secondary winding of said transformer matches said laser through a resistor having a resistive value substantially equal to the difference in impedance between said secondary winding of said transformer and said laser.

9. The circuit according to claim 8 further including a capacitor being connected in parallel with said resistor for forming a tilt circuit for compensating negative sloping effects of said transformer and said laser.

10. The circuit according to claim 7 wherein said circuit and said laser is enclosed in a hermetically sealed package.

11. The circuit according to claim 10 wherein said RF choke and said capacitor receives said bias current and said modulation current from a single input lead of said package.

* * * * *